United States Patent [19]

Yee

[11] Patent Number: 4,707,624
[45] Date of Patent: Nov. 17, 1987

[54] OFFSET CANCELLATION SCHEME FOR A DIFFERENTIAL RESET STABILIZED LATCH

[75] Inventor: Philip W. Yee, Mountain View, Calif.

[73] Assignee: National Semiconductor Corp., Santa Clara, Calif.

[21] Appl. No.: 905,865

[22] Filed: Sep. 10, 1986

[51] Int. Cl.4 .......................................... H03K 3/023
[52] U.S. Cl. .................................. 307/491; 307/362; 307/494
[58] Field of Search ................ 307/362, 491, 530, 494

[56] References Cited
U.S. PATENT DOCUMENTS
4,450,368  5/1984  Spence .............................. 307/362

Primary Examiner—John Zazworsky
Attorney, Agent, or Firm—Limbach, Limbach & Sutton

[57] ABSTRACT

Circuitry is provided for effectively cancelling the offset voltage of a differential reset stabilized latch. The circuitry preadjusts the voltage on the latch's amplifier dual input nodes prior to application of the signal voltage to the latch input such that the positive amplifier input voltage is substantially equal to the positive output voltage and the negative amplifier input voltage is substantially equal to the negative output voltage.

4 Claims, 6 Drawing Figures

OFFSET CANCELLATION SCHEME FOR A DIFFERENTIAL RESET STABILIZED LATCH

BACKGROUND OF THE INVENTION

1. Field of the Invention

The present invention relates to semiconductor integrated circuits and, in particular, to a method and circuitry for providing a differential reset stabilized latch having offset cancellation.

2. Discussion of the Prior Art

Referring to FIG. 1A, in the operation of a conventional differential reset stabilized latch, negative feedback is first applied around the latch amplifier for reset stabilization. In the ideal case, $V_A = V_B$. Then, as shown in FIG. 1B, the negative feedback is removed and the input switches are thrown to reverse the differential latch inputs, $V_{signal}$ and $V_{ref}$. For purposes of this discussion and the detailed description that follows, it is assumed that $V_{signal}$ is greater than $V_{ref}$; however, the concepts presented herein are equally valid if $V_{signal}$ is less than $V_{ref}$. The voltage on the latch amplifier after the input switches are thrown is as shown in FIG. 1B, where the $V_{signal}$ is the differential signal and G is the gain. As shown in FIG. 1C, latch input $V_{signal}$ is then latched in by applying positive feedback around the latch amplifier. Thus, the latch, in this ideal case, is now in the high state corresponding to the assumption that latch input $V_{signal}$ is greater than latch reference $V_{ref}$. This ideal latch will latch high even if $V_{signal}$ is only infinitesimally greater than $V_{ref}$.

Unfortunately, the two input transistors of a differential reset stabilized latch are never perfectly matched. As a result, a differential offset voltage is inherent at the input to such devices. That is, referring back to FIG. 1A, $V_A$ does not equal $V_B$ after application of negative feedback.

Referring again to FIG. 1B, as just stated, for a "real world" differential reset stabilized latch, $V_A$ will be different from $V_B$. The offset voltage $V_{os}$ can be calculated by determining what change in $V_A$ is required to make the voltage at Node A equal to the voltage at Node C.

Since $V_A + V_{os} = V_B + GV_{os}$ (G = gain)

$V_{os}(G - 1) = V_A - V_B$ then, $V_{os} = \dfrac{V_A - V_B}{G - 1}$

Assuming $V_{os}$ is positive, if the differential signal $\Delta V_{signal}$ is less than $V_{os}$, then the latch will provide the wrong output when positive feedback is applied. Thus, the "real world" latch requires that $V_{signal}$ be greater than $V_{ref}$ by at least the offset voltage $V_{os}$ before it will latch high.

SUMMARY OF THE INVENTION

The present invention provides for the effective cancellation of the offset of a differential reset stabilized latch. This is accomplished by preadjusting the voltage on the latch's differential amplifier input nodes prior to application of the desired latch input signal such that the positive amplifier input voltage is substantially equal to the positive output voltage of the device and the negative amplifier input voltage is substantially equal to the negative output voltage of the device.

According to the method of the present invention, a reference voltage is applied to a first input of a differential reset stabilized latch and a signal voltage is applied to a second input of the latch while negative feedback is simultaneously applied to both inputs of the latch's amplifier. Negative feedback is then removed from the amplifier and the voltages at the first and second amplifier inputs are adjusted to be substantially equal to the voltages at the latch's first and second outputs, respectively. The latch input voltages are then reversed such that the signal voltage is applied to the first latch input and the reference voltage is applied to the second latch input. Positive feedback is then applied to both amplifier inputs such that the latch latches in a state corresponding to the signal voltage.

DETAILED DESCRIPTION OF A PREFERRED EMBODIMENT

Figure 2A:
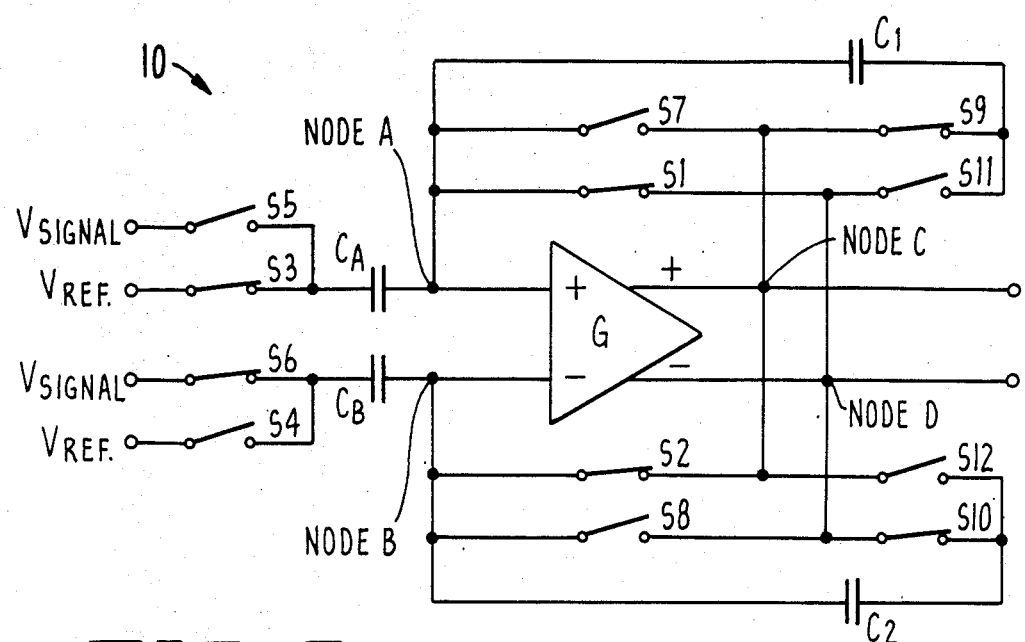
FIG. 2A is a schematic diagram illustrating a differential reset stabilized latch in accordance with the present invention in the negative feedback mode.

FIG. 2A shows a differential reset stabilized latch 10 having gain G. A first input to the amplifier 12 of latch 10 is provided at Node A and a first output of the latch 10 is provided at Node C. A second input to the amplifier 12 of latch 10 is provided at Node B and a second output of the latch is provided at Node D.

Either a first voltage $V_{signal}$ or a second voltage $V_{ref}$ may be applied to the first input of latch 10 by closing switch S5 and opening switch S3 or by opening switch S5 and closing switch S3, respectively. This input is hereinafter referred to as the first latch input. Similarly, either the first voltage $V_{signal}$ or the second voltage $V_{ref}$ may be applied to the second input of the latch 10 by closing switch S6 and opening switch S4 or by opening switch S6 and closing switch S4, respectively. This input is hereinafter referred to as the second latch input.

As shown in FIG. 2A, negative feedback is provided around the latch 10 by connecting the first output Node C to the second amplifier input Node B through switch S2 and, similarly, by connecting the second output Node D to the first amplifier input Node A through switch S1.

Positive feedback is provided around the latch 10 by connecting the second output Node D to the second amplifier input Node B through switch S8 and by connecting the first output Node C to the first amplifier input Node A through switch S7.

Figure 1A:
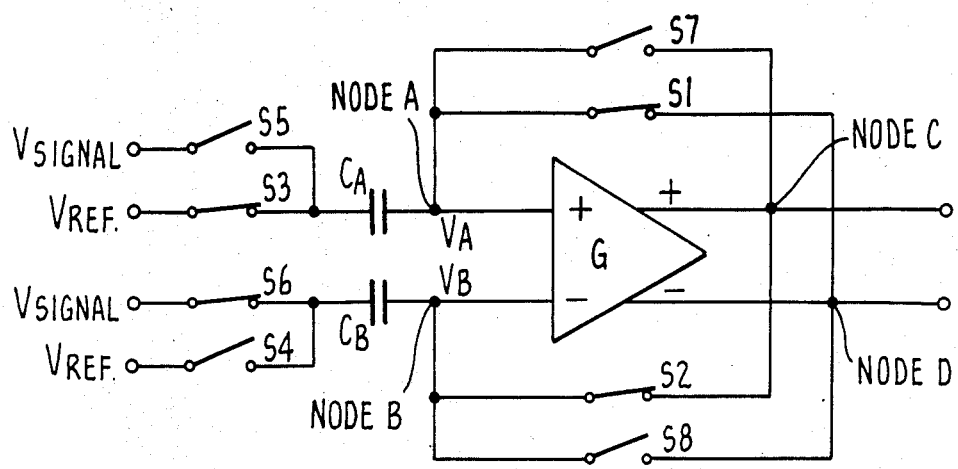
FIG. 1A is a schematic diagram illustrating a prior art differential reset stabilized latch in the negative feedback mode.
Figure 1B:
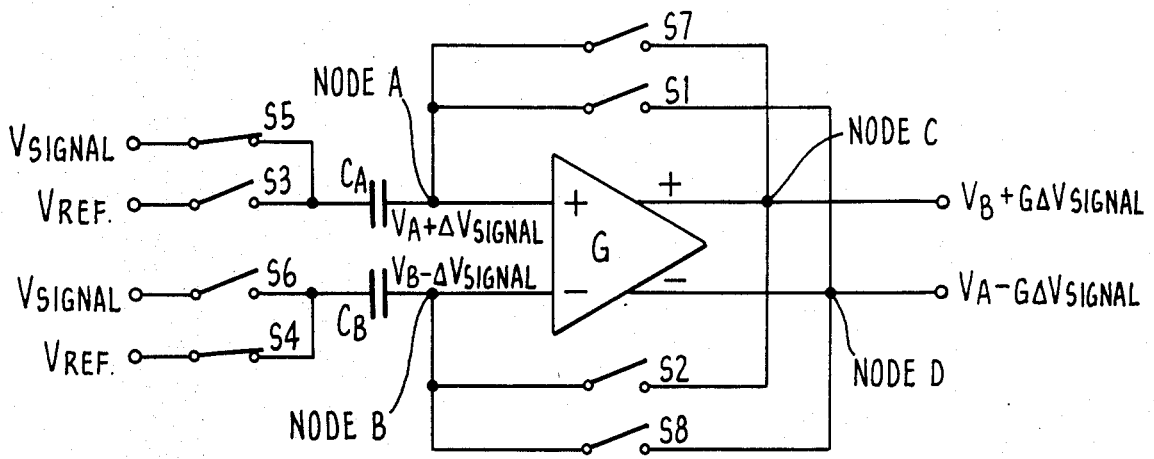
FIG. 1B is a schematic diagram illustrating the prior art differential reset stabilized latch shown in FIG. 1A with negative feedback removed and the input signal and reference signal reversed from the state shown in FIG. 1A.
Figure 1C:
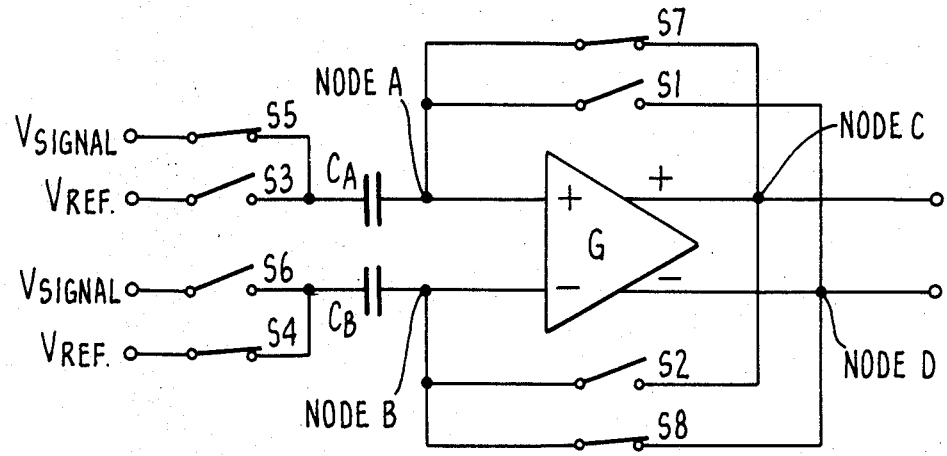
FIG. 1C is a schematic diagram illustrating the prior art differential reset stabilized latch shown in FIGS. 1A and 1B with the input signal latched in by application of positive feedback.

The foregoing also describes a conventional differential reset stabilized latch of the type shown in FIGS. 1A–1C.

According to the present invention, the following modifications are made to the above-described configuration to provide the capability for eliminating its inherent offset:

A connection is provided between the first output Node C and the first amplifier input Node A through switch S9 and capacitor $C_1$;

A connection is provided between the first output Node C and the second amplifier input Node B through switch S12 and capacitor $C_2$;

A connection is provided between the second output Node D and the second amplifier input Node B through switch S10 and capacitor $C_2$; and A connection is provided between the second output Node D and the first amplifier input Node A through switch S11 and capacitor $C_1$.

Figure 2B:
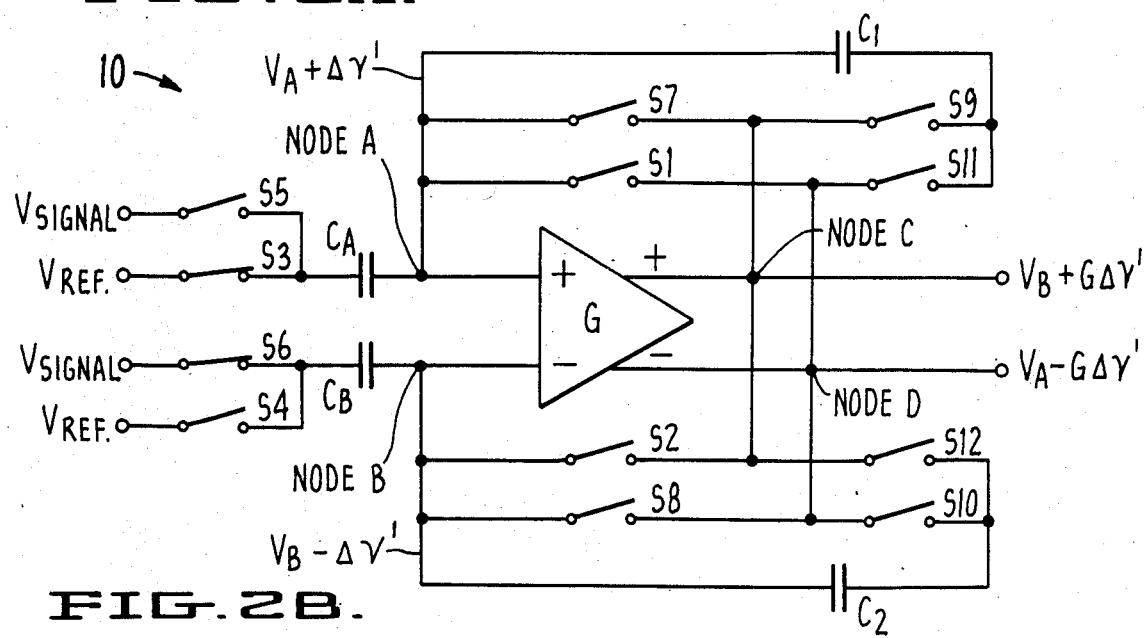
FIG. 2B is a schematic diagram illustrating the differential reset stabilized latch shown in FIG. 2A with input voltage adjustment in accordance with the present invention.
Figure 2C:
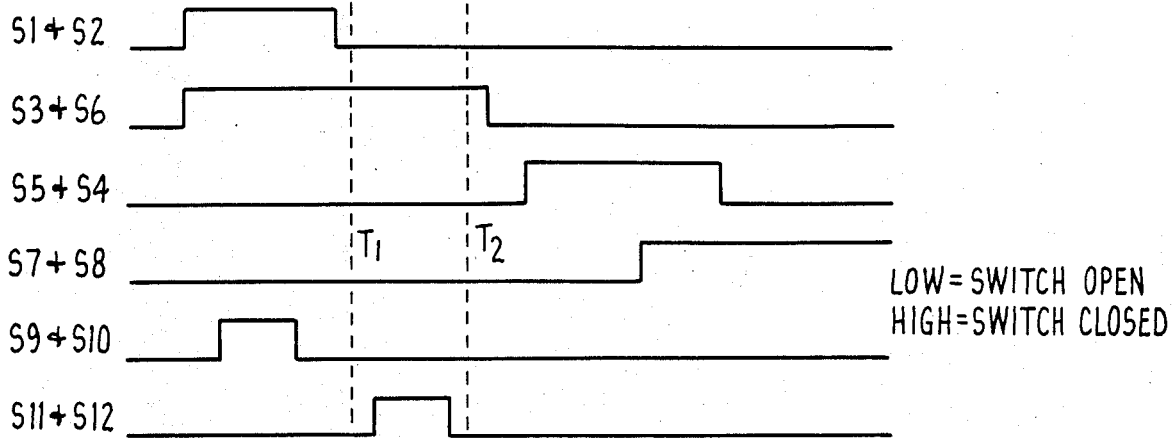
FIG. 2C is a timing diagram illustrating the operation of the differential reset stabilized latch shown in FIGS. 2A and 2B.

Referring to the circuit shown in FIG. 2A and its associated timing diagram shown in FIG. 2C, at time $T_1$, the above-described latch 10 is reset by applying negative feedback. In this configuration, the added capacitor $C_1$ is charged to $V_B - V_A$; similarly, capacitor $C_2$ is charged to $V_A - V_B$. In this "real world" device, the offset voltage is $$V_{os} = (V_A - V_B)/(G-1)$$

Between times $T_1$ and $T_2$, after removing the negative feedback and before reversing the voltages $V_{signal}$ and $V_{ref}$, and additional step is added where the voltages $V_A$ and $V_B$ are adjusted by interchanging the connections of the capacitors $C_1$ and $C_2$.

Referring to FIG. 2B, $\Delta V'$ denotes the change in voltage at Node A from time $T_1$ to time $T_2$ while, $-\Delta V'$ denotes the change at Node B. FIG. 2C denotes the position of the switches S1–S12 at time $T_2$. The voltage at Node A at time $T_2$ can be calculated as follows:

$$(V_A - G\Delta V') - (V_A + \Delta V') = V_B - V_A + \frac{C_A \Delta V'}{C_1}$$

$$-(G+1)\Delta V' = V_B - V_A + \frac{C_A}{C_1}\Delta V',$$

thus $$\Delta V' = \frac{(V_A - V_B)}{\left(G + 1 + \frac{C_A}{C_1}\right)}$$

Similarly, $$-\Delta V' = \frac{(V_A - V_B)}{\left(G + 1 + \frac{C_B}{C_2}\right)}$$

where $C_{A(B)}$ denotes all the capacitance on Node A(B) except $C_{1(2)}$ and $V_A(V_B)$ denotes the voltage at Node A(B) at time, $T_1$.

At Node A, this is to be compared with $$V_{os} = \frac{V_A - V_B}{G - 1}$$

If capacitors $C_1$ and $C_2$ are chosen such that $C_1 = C_A = C_B = C_2$, and $G = 100$, then $$\frac{V_{os} - \Delta V'}{V_{os}} = \frac{\frac{1}{99} - \frac{1}{102}}{\frac{1}{99}} = 0.029$$

Thus, for these conditions, there is 97.1% offset cancellation in the aforedescribed differential reset stabilized latch.

The voltages $V_{signal}$ and $V_{ref}$ applied to the first and second latch inputs as shown in FIG. 2B are then reversed according to conventional device operating procedure and positive feedback is applied around the amplifier to latch in the difference between $V_{signal}$ and $V_{ref}$.

Although a preferred embodiment of the invention has been illustrated and described, it should be understood that the invention is not limited to the specifics of this embodiment, but rather is defined by the accompanying claims.

What is claimed is:

1. In a differential reset stabilize latch of the type which receives first and second latch inputs and which includes a differential amplifier having first and second amplifier inputs connected to receive the first and second latch inputs, respectively, and corresponding first and second amplifier outputs, and which further includes a switched connection between the second amplifier output and the first amplifier input for selectively applying negative feedback to the first amplifier input, a switched connection between the first amplifier output and the first amplifier input for selectively applying positive feedback to the first amplifier input, a switched connection between the first amplifier output and the second amplifier input for selectively applying negative feedback to the second amplifier input, and a switched connection between the second amplifier output and the second amplifier input for selectively applying positive feedback to the second amplifier input, and wherein the latch operates to provide a differential output voltage corresponding to the difference between first and second input voltages by applying negative feedback to the first and second amplifier inputs while the first input voltage is applied to the first latch input and the second input voltage is applied to the second latch input, the negative feedback then being removed from the first and second amplifier inputs and the input voltages reversed such that second input voltage is applied to the first latch input and the first input voltage is applied to the second latch input, followed by application of positive feedback to the first and second amplifier inputs, the improvement comprising circuitry connected to the latch for substantially cancelling the offset voltage associated with the latch prior to reversal of the input voltages.

2. A differential reset stabilized latch as in claim 1 wherein the first latch input is connected to the first amplifier input through a first input capacitor and the second latch input is connected to the second amplifier input through a second input capacitor and wherein the offset voltage cancellation circuitry comprises a first switched connection between the first amplifier output and the first amplifier input through a first cancellation capacitor;

a second switched connection between the first amplifier output and the second amplifier input through a second cancellation capacitor;

a third switched connection between the second amplifier output and the second amplifier input through the second cancellation capacitor; and a fourth switched connection between the second amplifier output and the first amplifier input through the first cancellation capacitor.

3. A differential reset stabilizes latch as in claim 2 wherein the capacitance of the first input capacitor is substantially equal to that of the first cancellation capacitor and the capacitance of the second input capacitor is substantially equal to that of the second cancellation capacitor.

4. A method of substantially cancelling the offset voltage of a differential reset stabilized latch of the type which receives first and second latch inputs and which includes a differential amplifier having first and second amplifier inputs connected to receive the first and second latch inputs, respectively, and corresponding first and second amplifier outputs, and which further includes a switched connection between the second amplifier output and the first amplifier input for selectively applying negative feedback to the first amplifier input, a switched connection between the first amplifier output and the first amplifier input for selectively applying positive feedback to the first amplifier input, a switched connection between the first amplifier output and the second amplifier input for selectively applying negative feedback to the second amplifier input, and a switches connection between the second amplifier output and the second amplifier input for selectively applying positive feedback to the second amplifier input, the method comprising the sequential steps of:

applying a first input voltage to the first latch input and a second input voltage to the second latch input while simultaneously applying negative feedback to the first and second amplifier inputs;

removing the negative feedback from the first and second amplifier inputs;

adjusting the voltages at the first and second amplifier inputs to be substantially equal to the voltages at the first and second amplifier outputs, respectively;

reversing the first and second input voltages such that the first input voltage is applied to the second latch input and the second input voltage is applied to the first latch input; and applying positive feedback to the first and second amplifier inputs such that the latch generates a differential output corresponding to the difference between the first and second input voltages.

* * * * *

UNITED STATES PATENT AND TRADEMARK OFFICE
CERTIFICATE OF CORRECTION

PATENT NO. : 4,707,624
DATED : Nov. 17, 1987
INVENTOR(S) : Philip W. Yee

It is certified that error appears in the above—identified patent and that said Letters Patent is hereby corrected as shown below:

Col. 1, line 25 "$V_{signal}$" should be --$\Delta V_{signal}$--.

Col. 4, line 22 "stabilize" should be --stabilized--.

Col. 6, line 3 "switches" should be --switched--.

Signed and Sealed this

Twelfth Day of April, 1988

Attest:

DONALD J. QUIGG

Attesting Officer     Commissioner of Patents and Trademarks